United States Patent
Iwata

(10) Patent No.: US 10,721,851 B2
(45) Date of Patent: Jul. 21, 2020

(54) SYSTEM FOR PERFORMING WORK ON SUBSTRATE AND INSERTION METHOD

(71) Applicant: FUJI MACHINE MFG. CO., LTD., Chiryu-shi (JP)

(72) Inventor: Takuya Iwata, Chiryu (JP)

(73) Assignee: FUJI MACHINE MFG. CO., LTD., Chiryu-shi (JP)

( * ) Notice: Subject to any disclaimer, the term of this patent is extended or adjusted under 35 U.S.C. 154(b) by 270 days.

(21) Appl. No.: 15/768,748

(22) PCT Filed: Oct. 22, 2015

(86) PCT No.: PCT/JP2015/079812
§ 371 (c)(1),
(2) Date: Apr. 16, 2018

(87) PCT Pub. No.: WO2017/068682
PCT Pub. Date: Apr. 27, 2017

(65) Prior Publication Data
US 2018/0303016 A1   Oct. 18, 2018

(51) Int. Cl.
*H05K 3/30* (2006.01)
*H05K 13/08* (2006.01)
(Continued)

(52) U.S. Cl.
CPC ......... *H05K 13/08* (2013.01); *H05K 13/0069* (2013.01); *H05K 13/04* (2013.01);
(Continued)

(58) Field of Classification Search
CPC .... H05K 13/08; H05K 13/04; H05K 13/0473; H05K 13/0069; H05K 13/0404;
(Continued)

(56) References Cited

U.S. PATENT DOCUMENTS

| 4,288,914 A * | 9/1981 | Vancelette | H05K 13/0473 29/741 |
| 5,044,062 A * | 9/1991 | Maskens | H05K 13/0473 29/739 |
| 7,568,284 B2 * | 8/2009 | Kadota | H05K 13/0439 29/837 |

FOREIGN PATENT DOCUMENTS

| CN | 104378966 A | 2/2015 |
| JP | 5-63396 A | 3/1993 |

(Continued)

OTHER PUBLICATIONS

International Search Report dated Jan. 26, 2016, in PCT/JP2015/079812 filed Oct. 22, 2015.

*Primary Examiner* — Donghai D Nguyen
(74) *Attorney, Agent, or Firm* — Oblon, McClelland, Maier & Neustadt, L.L.P.

(57) ABSTRACT

A cut and clinch device is provided with a pair of slide bodies, unit main body that holds the pair of slide bodies so as to be capable of moving towards and away from each other, and pitch changing mechanism that changes an insertion hole spacing distance that is a distance between insertion holes formed in the pair of slide bodies. Also, the leaded component held by the component holding tool is imaged by the imaging device before the leads are inserted into the through-holes of the board, and based on the imaging data, the lead spacing distance that is the distance between the pair of leads of the leaded component is calculated. Then, the pair of slide bodies are moved towards or away from each other such that the calculated lead spacing distance and the insertion hole spacing distance are the same.

4 Claims, 15 Drawing Sheets

(51) Int. Cl.
*H05K 13/04* (2006.01)
*H05K 13/00* (2006.01)
*G06T 7/00* (2017.01)

(52) U.S. Cl.
CPC ....... *H05K 13/0404* (2013.01); *H05K 13/046* (2013.01); *H05K 13/0473* (2013.01); *G06T 7/001* (2013.01); *G06T 2207/30164* (2013.01); *Y10T 29/4914* (2015.01)

(58) Field of Classification Search
CPC .. H05K 13/046; H05K 13/0813; G06T 7/001; G06T 2207/30164; Y10T 29/4913; Y10T 29/49131; Y10T 29/49139; Y10T 29/4914; Y10T 29/53183
USPC ........................... 29/832, 833, 837, 838, 741
See application file for complete search history.

(56) References Cited

FOREIGN PATENT DOCUMENTS

| | | |
|---|---|---|
| JP | 2851692 B2 | 1/1999 |
| JP | 2015-37084 A | 2/2015 |
| KR | 10-2015-0020306 A | 2/2015 |
| WO | WO 2015/145730 A1 | 10/2015 |

\* cited by examiner

SYSTEM FOR PERFORMING WORK ON SUBSTRATE AND INSERTION METHOD

TECHNICAL FIELD

The present application relates to a board work system that mounts leaded components on a board, and to an insertion method for inserting a lead of a leaded component into a through-hole of a board.

BACKGROUND ART

When mounting leaded components on a board, a lead of a leaded component is inserted into a through-hole of the board. Then, the lead is bent by being inserted into a bending device for bending the lead via the through-hole of the board. Disclosed in the patent literature below is technology for appropriately inserting a lead of a leaded component into an insertion hole of a bending device.

Patent literature 1: JP-A-H5-63396

BRIEF SUMMARY

Technical Problem

According to technology disclosed in the above patent literature, it is possible to a certain extent to insert a lead of a leaded component into an insertion hole of a bending device. However, although the above patent literature discloses an imaging device and indicates usage of image data from the imaging device, details of an insertion method for a lead are not disclosed, and it is desirable to even more appropriately insert a lead of a leaded component into an insertion hole of a bending device. The present disclosure takes account of such circumstances and an object thereof is to appropriately insert a lead of a leaded component into an insertion hole of a bending device.

Solution to Problem

To solve the above problems, a board work system of the present disclosure includes: a holding device configured to hold a board, the board being formed with a through-hole into which a lead of a leaded component is to be inserted; a mounting head configured to hold the leaded component and to insert each of a pair of leads of the held leaded component into the through-holes of the board held by the holding device; a bending device configured to bend a lead inserted into the insertion hole, the bending device including (A) a pair of moving bodies each including an insertion hole into which a lead is inserted via the through-hole, (B) a holding body configured to hold the pair of moving bodies such that the moving bodies can be moved towards and away from each other, and (C) a drive source that changes an insertion hole spacing distance that is a distance between the insertion holes to a given distance by moving the pair of moving bodies towards and away from each other; an imaging device configured to image the leaded component held by the mounting head; and a control device, the control device being configured to control the drive source based on the lead spacing distance that is a distance between the pair of leads obtained by the imaging device imaging the pair of leads of the leaded component prior to being inserted into the through-holes.

To solve the above problems, an insertion method of the present disclosure is: an insertion method for inserting a pair of leads of a leaded component into a pair of insertion holes via a pair of through-holes in a board work system, the board work system including a holding device configured to hold a board, the board being formed with a through-hole into which a lead of a leaded component is to be inserted; a mounting head configured to hold the leaded component and to insert each of the pair of leads of the held leaded component into the through-holes of the board held by the holding device; a bending device configured to bend a lead inserted into the insertion hole, the bending device including (A) a pair of moving bodies each including an insertion hole into which a lead is inserted via the through-hole, (B) a holding body configured to hold the pair of moving bodies such that the moving bodies can be moved towards and away from each other, and (C) a drive source that changes an insertion hole spacing distance that is a distance between the insertion holes to a given distance by moving the pair of moving bodies towards and away from each other; and an imaging device configured to image the leaded component held by the mounting head, the insertion method including: imaging the leaded component held by the mounting head; acquiring a lead spacing distance that is a distance between the pair of leads of the leaded component based on imaging data obtained by the imaging; controlling operation of the drive source based on the acquired lead spacing distance; and inserting the pair of leads of the leaded component held by the mounting head into the pair of insertion holes via the pair of through-holes.

Advantageous Effects

With the board work system and the insertion method of the present disclosure, a bending device includes a pair of moving bodies, and a holding body configured to hold the pair of moving bodies so as to be movable towards and away from each other, and insertion holes into which leads are to be inserted via through-holes of the board are formed in each moving body. Also, at the bending device, the pair of leads are inserted into the holes of the pair of moving bodies, and that pair of leads is bent. With the bending device, it is possible to perform control to change the insertion hole spacing distance that is a distance between the insertion holes of the pair of moving bodies by moving the pair of moving bodies towards and away from each other. Also, the leaded component held by the mounting head is imaged by the imaging device before the leads are inserted into the through-holes of the board, and based on the imaging data, the lead spacing distance that is the distance between the pair of leads of the leaded component is acquired. Then, operation of the drive source is controlled based on the acquired lead spacing distance. Thus, it is possible to align the positions of the tips of the pair of leads and the positions of the pair of insertion holes in the vertical direction, such that the leads of the leaded component are appropriately inserted into the insertion holes of the bending device.

DESCRIPTION OF PREFERRED EMBODIMENTS

The following describes in detail referring to the figures an example embodiment of the present disclosure.

Configuration of Component Mounter

Figure 1:
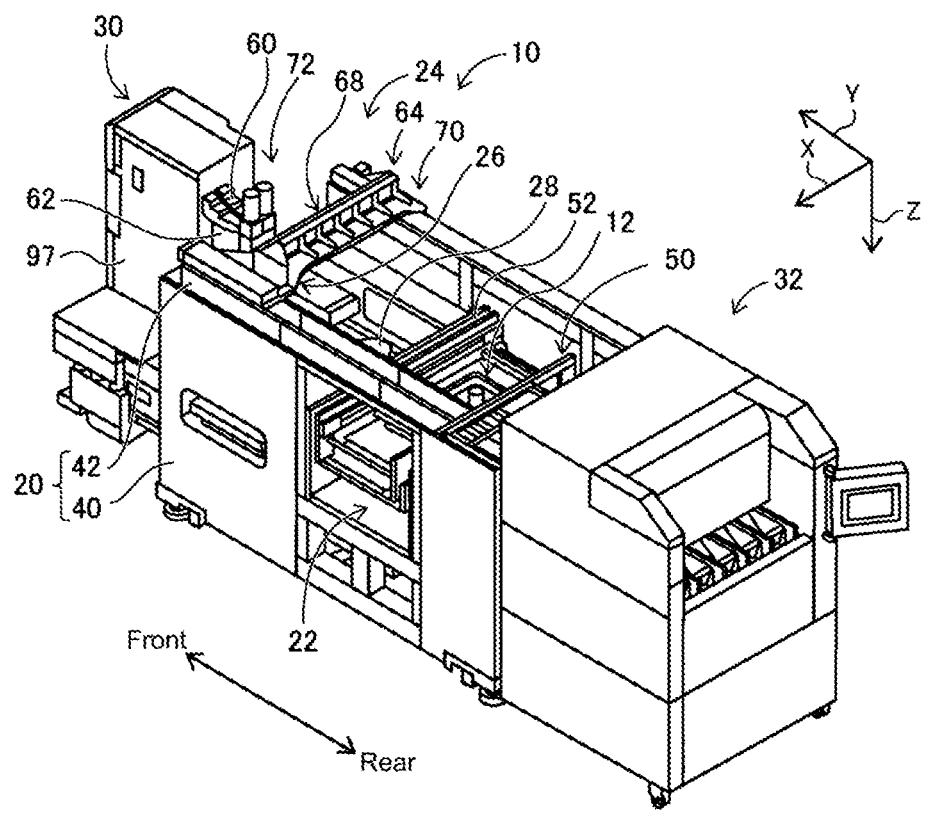
FIG. 1 is a perspective view of a component mounter.

FIG. 1 shows component mounter 10. Component mounter 10 performs work of mounting components on circuit board 12. Component mounter 10 is provided with device main body 20, board conveying and holding device 22, component mounting device 24, mark camera 26, component camera 28, component supply device 30, loose component supply device 32, cut and clinch device (refer to FIG. 7) 34, and control device (refer to FIG. 12) 36. Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on the frame section 40. Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Component mounting device 24 is provided on beam section 42, and includes work heads 60 and 62 and work head moving device 64. Work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, work heads 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

Figure 2:
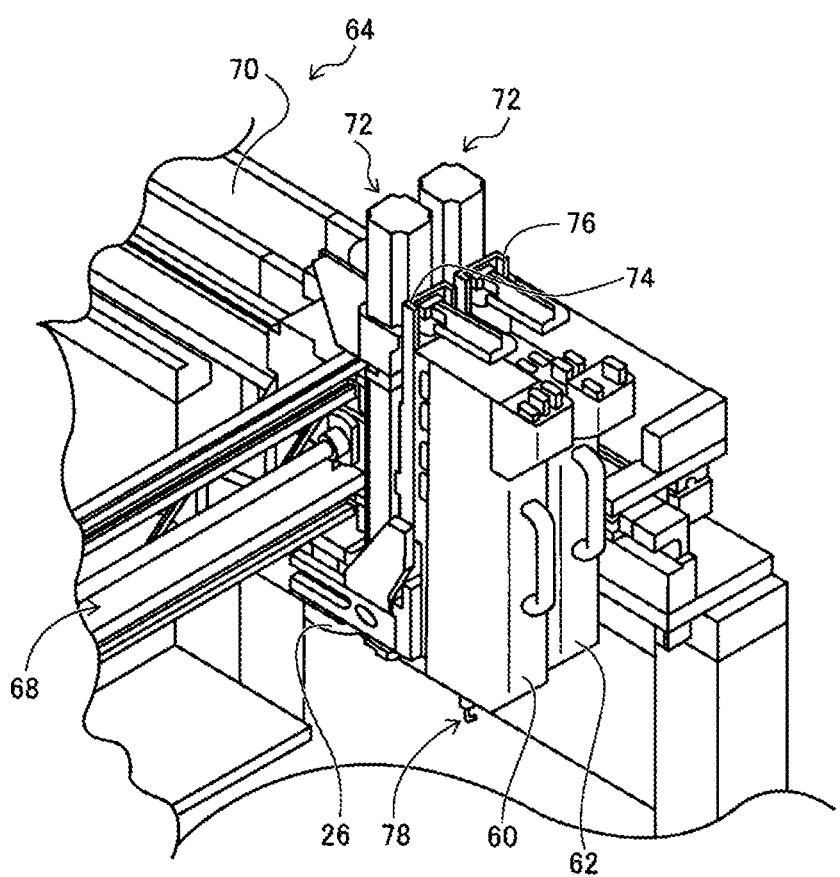
FIG. 2 is a perspective view of a component mounting device.
Figure 3:
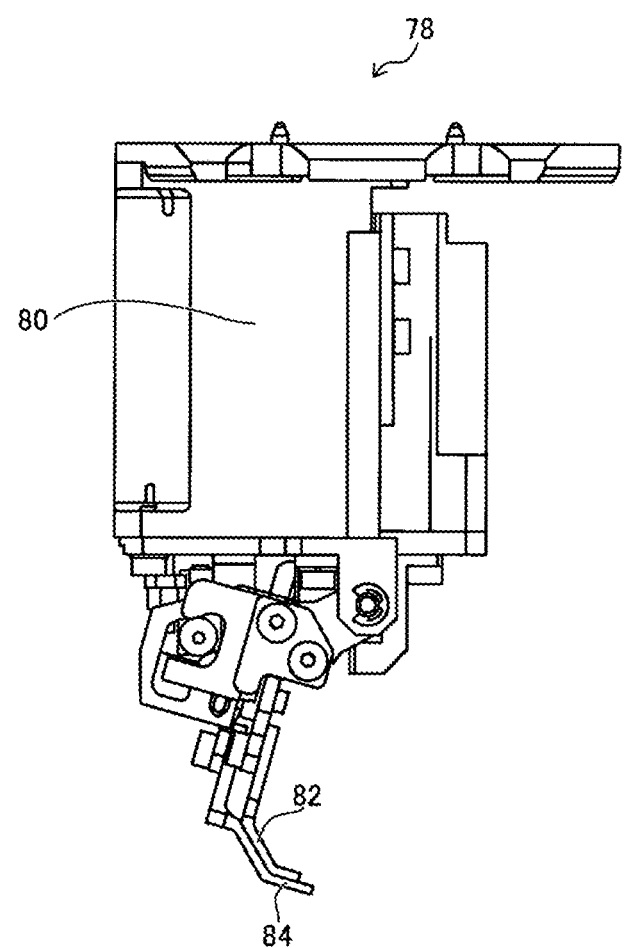
FIG. 3 is a side view of a component holding tool.
Figure 4:
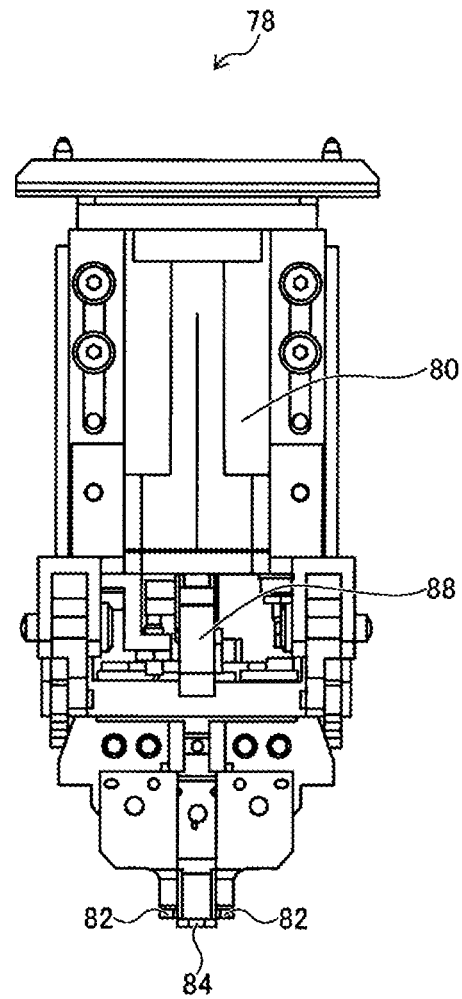
FIG. 4 is a front view of the component holding tool.
Figure 5:
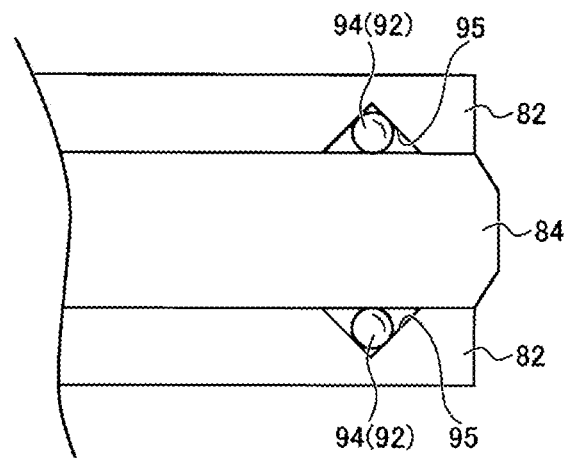
FIG. 5 is an enlarged view of the top section of the component holding tool.

Also, as shown in FIG. 2, component holding tool 78 is attached to the bottom surface of each work head 60 and 62. Component holding tool 78 is for holding leads of a leaded component, and as shown in FIGS. 3 to 5, includes main body section 80, pair of claws 82, support plate 84, opening and closing device (refer to FIG. 12) 86, pusher 88, and raising and lowering device (refer to FIG. 12) 90. Note that, FIG. 3 is a side view of component holding tool 78, FIG. 4 is a front view of component holding tool 78, and FIG. 5 is an enlarged view of the pair of claws 82 and support plate 84 seen from above.

Figure 6:
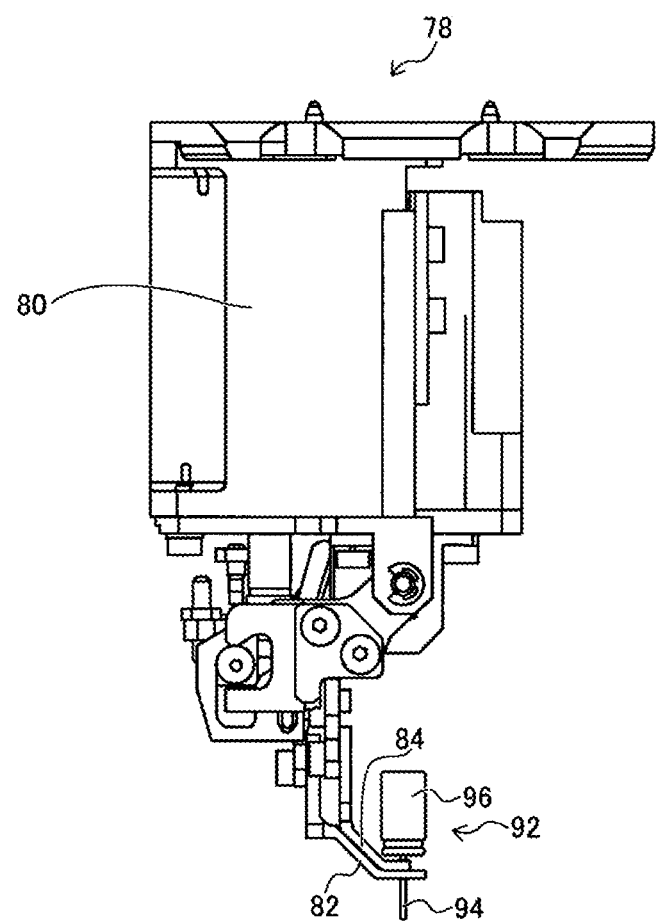
FIG. 6 is a side view of the component holding tool when holding a leaded component.

The pair of claws 82 are swingably held by main body section 80, and by operation of opening and closing device 86 the tip sections of the pair of claws 82 are moved towards and away from each as the claws swing. Recesses 95 with a size in accordance with the lead diameter of lead 94 of leaded component 92 that is to be held are formed on the insides of the pair of claws 82. Also, support plate 84 is positioned between the pair of claws 82, and swings together with the pair of claws 82. When this occurs, support plate 84 enters between the pair of leads 94 of leaded component 92. Also, by the pair of claws 82 moving towards support plate 84, each of the pair of leads 94 of leaded component 92 is sandwiched between recess 95 of claw 82 and support plate 84. Thus, as shown in FIG. 6, leaded component 92 is held by the pair of claws 82 at a base end of leads 94, that is, at the end close to component main body 96 of leaded component 92. Here, bending and curvature of leads 94 is corrected to a certain extent by leads 94 being gripped by recesses 95 of claws 82 and support plate 84. Also, pusher 88 is held by main body section 80 to be vertically movable, and is raised and lowered by operation of raising and lowering device 90. Note that, pusher 88, when lowered, contacts component main body 96 of leaded component 92 held by the pair of claws 82, so as to push leaded component 92 down.

Further, as shown in FIG. 2, mark camera 26 is attached to slide 74 in a state facing downwards, and is moved in the X direction, Y direction, and Z direction together with work head 60. Thus, mark camera 26 images any position on frame section 40. As shown in FIG. 1, component camera 28 is provided in a state facing upwards on frame section 40 between board conveying and holding device 22 and component supply device 30. Thus, component camera 28 images a component held by component holding tool 66 of work heads 60 and 62.

Component supply device 30 is provided at an end of frame section 40 in the front-rear direction. Component supply device 30 includes tray-type component supply device 97 and feeder-type component supply device (refer to FIG. 12) 98. Tray-type component supply device 97 supplies components in a state arranged in a tray. Feeder-type component supply 98 device supplies components via a tape feeder or stick feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation.

Note that, components supplied by component supply device 30 and loose component supply device 32 may include electronic circuit components, configuration components of solar panels, configuration components of power modules, and the like. Also, electronic circuit components include components with leads and components without leads.

Figure 7:
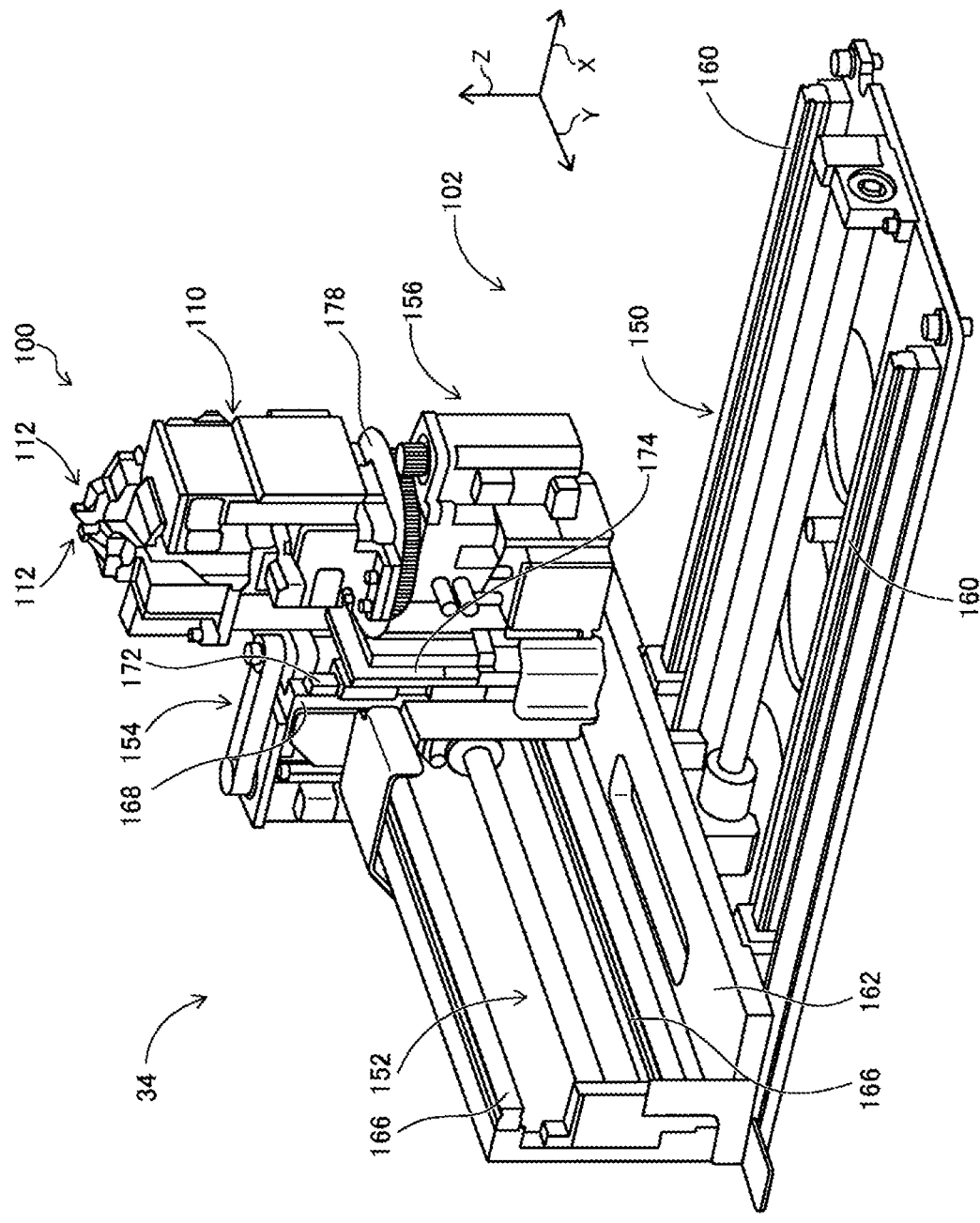
FIG. 7 is a perspective view of a cut and clinch device.
Figure 8:
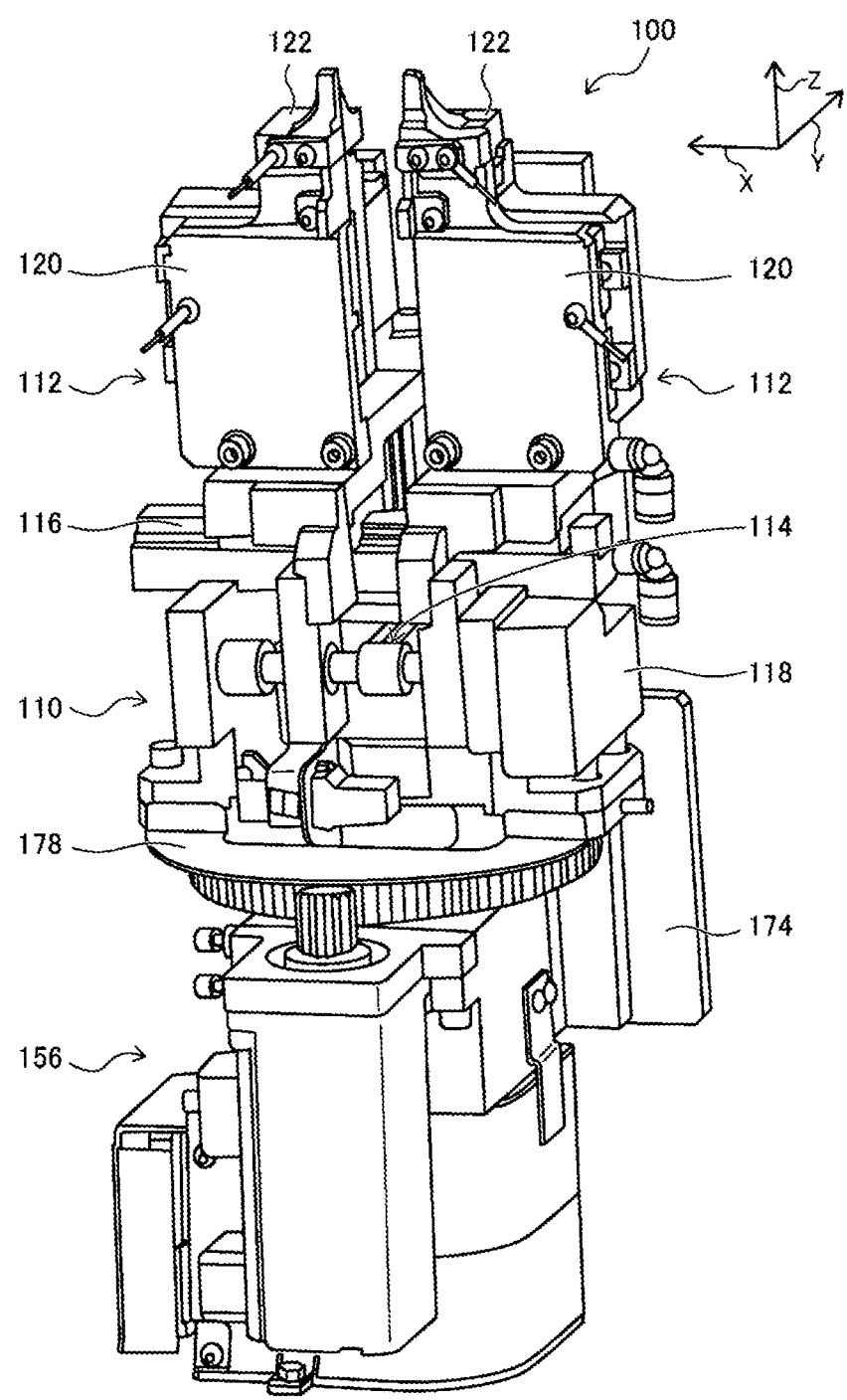
FIG. 8 is a perspective view of a cut and clinch unit.

Cut and clinch device 34 is arranged below conveyance device 50 and, as shown in FIG. 7, includes cut and clinch unit 100 and unit moving device 102. As shown in FIG. 8, cut and clinch unit 100 includes unit main body 110, pair of slide bodies 112, and pitch changing mechanism 114. At an upper end of unit main body 110, slide rail 116 is arranged extending in the X direction. The pair of slide bodies 112 is supported by slide rail 116 so as to be movable. By this, the pair of slide bodies 112 move towards and away from each other in the X direction. Also, pitch changing mechanism 114 includes electromagnetic motor 118, and the distance between the pair of slide bodies 112 can be controllably changed by operation of electromagnetic motor 118.

Figure 9:
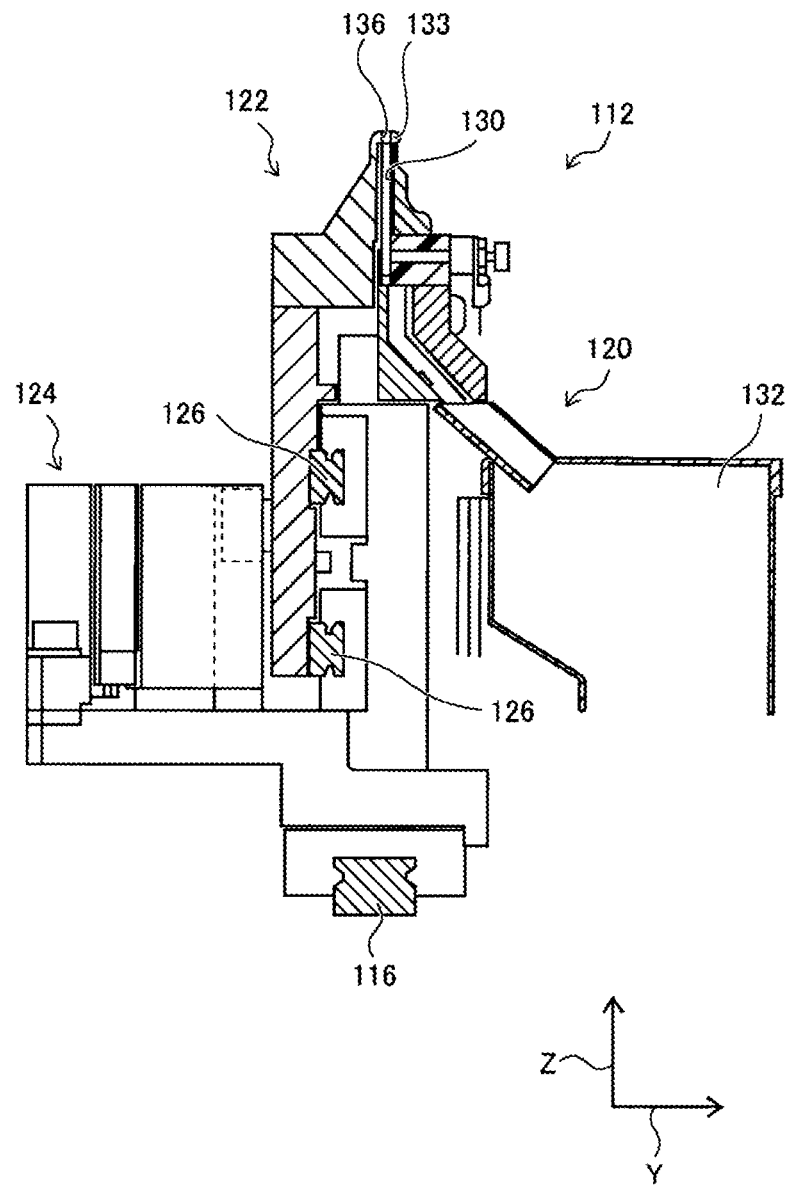
FIG. 9 is a cross section of a slide body.

Also, as shown in FIG. 9, each of the pair of slide bodies 112 includes fixed body section 120, movable section 122, and slide device 124, and is supported at fixed body section 120 so as to be slidable on slide rail 116. Two slide rails 126 are fixed to the rear side of fixed body section 120 extending in the X direction, and movable section 122 is slidably supported by those two slide rails 126. Thus, movable section 122 slides in the X direction with respect to fixed section 120. Also, slide device 124 includes electromagnetic motor (refer to FIG. 12) 128, and movable section 122 is controllably slid by operation of electromagnetic motor 128.

Also, the upper end section of fixed body section 120 is formed tapered towards the end, and first insertion hole 130 is formed so as to pierce the upper end section in a vertical direction. The upper end of first insertion hole 130 opens at the upper end surface of fixed section 120, and the edge that opens to the upper end surface is formed as fixed blade (refer to FIG. 16) 131. Also, the lower end of first insertion hole 130 opens to a side surface of fixed section 120, and discard box 132 is provided below the opening to the side surface.

Figure 10:
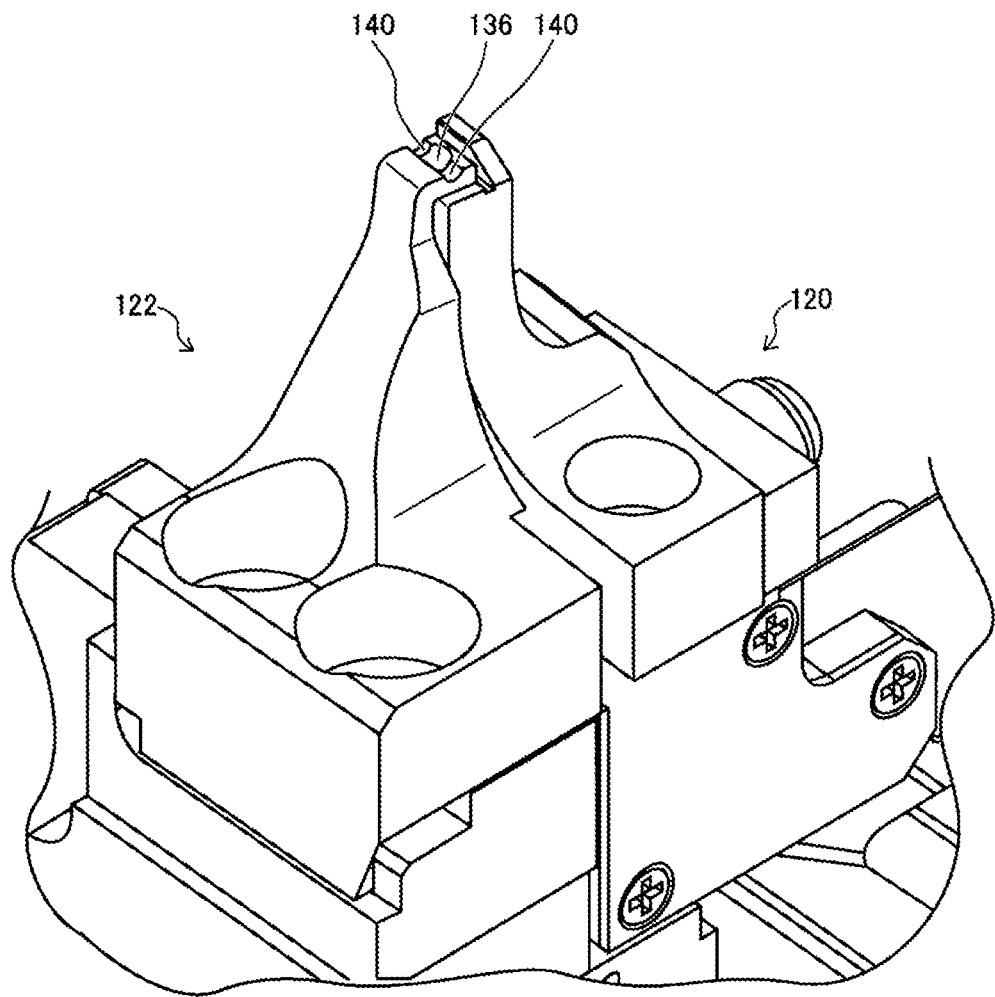
FIG. 10 is an enlarged view of the slide body.

Further, as shown in FIG. 10, an upper end section of movable section 122 is also formed tapered towards the end, and L-shaped curved section 133 is formed at the upper end section of movable section 122. Curved section 133 extends upwards of the upper end surface of fixed section 120, and there is slight clearance between curved section 133 and the upper end of main body section 120. And, first insertion hole 130 that opens at the upper end surface of fixed section 120 is covered by curved section 133, and second insertion hole 136 is formed in curved section 133 so as to face first insertion hole 130.

Figure 11:
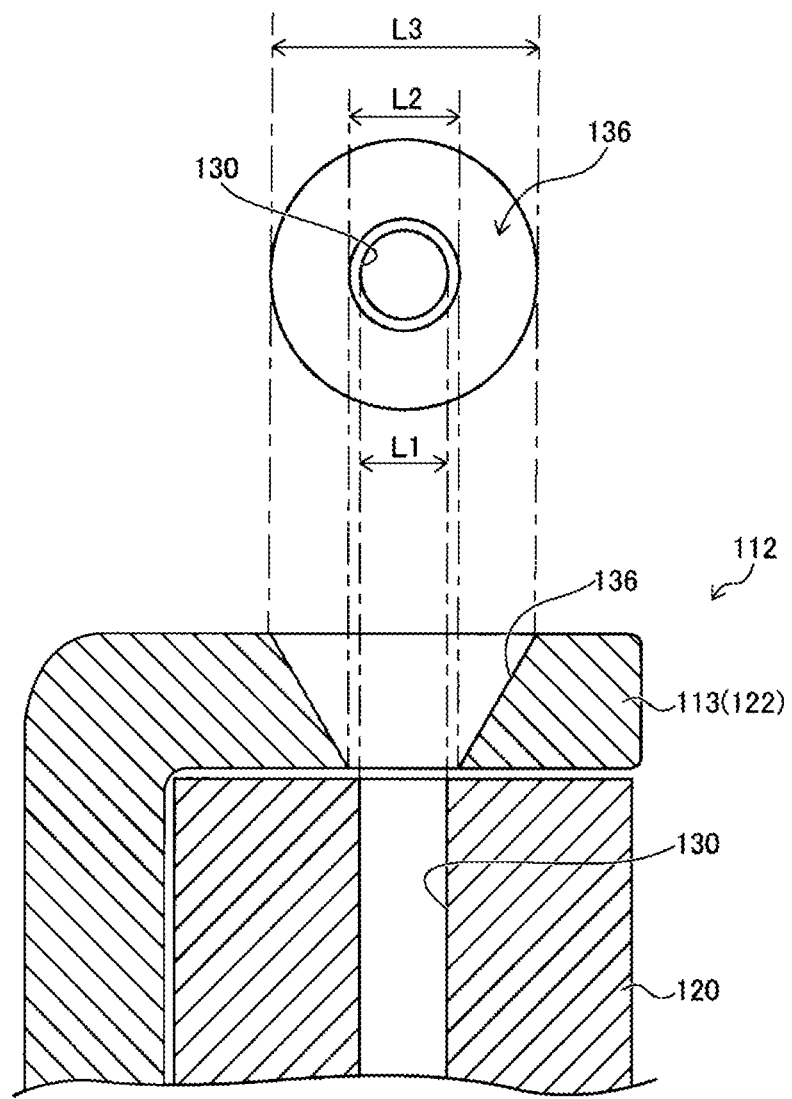
FIG. 11 is an enlarged view of an upper end of the slide body.

As shown in FIG. 11, second insertion hole 136 pierces through curved section 133 in a vertical direction, and an internal surface of second insertion hole 136 is a tapered surface configured with a diameter that gets smaller going down. On the other hand, the internal surface of first insertion hole 130 approaching the opening to the upper end surface of fixed section 120 is not a tapered surface, the internal surface of insertion hole 130 approaching the opening has an approximately regular diameter. Note that, the internal diameter of first insertion hole 130 is L1. On the other hand, the internal diameter of the opening on the lower end side of second insertion hole 136 is L2 (<L1), and the internal diameter of the opening on the upper end side is L3 (>L2).

Figure 16:
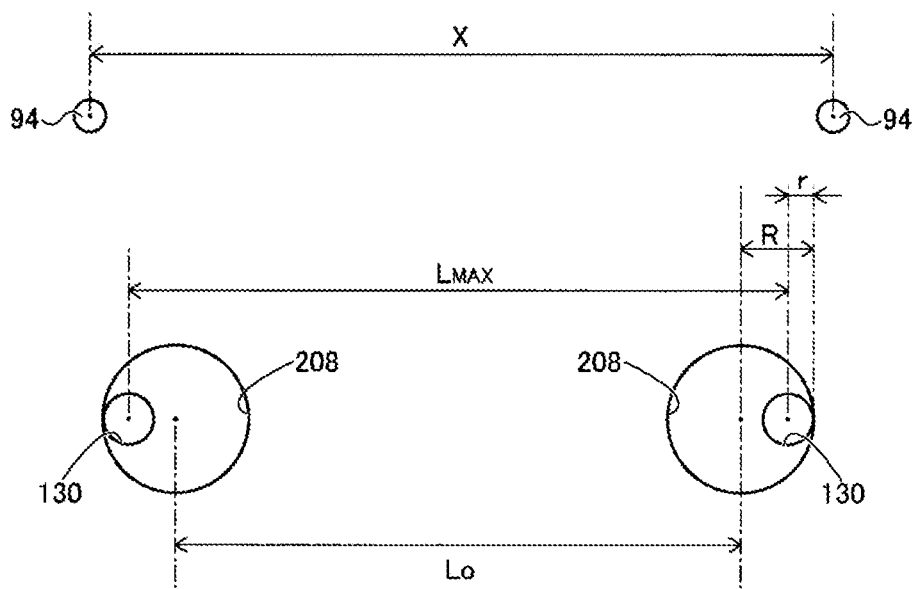
FIG. 16 is a schematic view illustrating the relationship between through-holes of the board and insertion holes of the cut and clinch device.

Also, the edge of second insertion hole 136 that opens to the lower end surface of curved section 133 is formed as movable blade 138 (refer to FIG. 16). Further, guide groove 140 is formed in the upper end surface of curved section 133 extending in the X-axis direction, that is, the sliding direction of movable section 122. Guide groove 140 is formed to straddle the opening of second insertion hole 136, and guide groove 140 and second insertion hole 136 are linked. Also, guide groove 140 is open at both side surfaces of curved section 133.

And, lead sensor (refer to FIG. 12) is provided on slide body 112. Lead sensor 146 detects insertion of lead 94 into first insertion hole 130 by lead 94 of leaded component 92 contacting the inside wall of first insertion hole 130 when lead 94 is inserted into first insertion hole 130 via second insertion hole 136. Thus, the internal dimension of first insertion hole 130 is slightly larger (by approximately 0.1 mm) than the outer dimensions of lead 94.

Also, as shown in FIG. 7, unit moving device 102 includes X-direction moving device 150, Y-direction moving device 152, Z-direction moving device 154, and rotation device 156. X-direction moving device 150 includes slide rail 160 and X slider 162. Slide rail 160 extends in the X direction, and X slider 162 is slidably supported on X slide rail 160. X slider 162 moves in the X direction by the driving of electromagnetic motor (refer to FIG. 12) 164. Y-direction moving device 152 includes slide rail 166 and Y slider 168. Slide rail 166 is arranged on X slider 162 extending in the Y direction, and Y slider 168 is slidably supported on slide rail 166. Y slider 168 moves in the Y direction by the driving of electromagnetic motor (refer to FIG. 12) 170. Z-direction moving device 154 includes slide rail 172 and Z slider 174. Slide rail 172 is arranged on Y slider 168 extending in the Z direction, and Z slider 174 is slidably supported on slide rail 172. Z slider 174 moves in the Z direction by the driving of electromagnetic motor (refer to FIG. 12) 176.

Further, rotation device 156 includes rotating table 178 that is roughly disc-shaped. Rotating table 178 is supported by Z slider 174 so as to be rotatable around its own center, and is rotated by the driving of electromagnetic motor (refer to FIG. 7) 180. Cut and clinch unit 100 is arranged on rotating table 178. According to such a configuration, cut and clinch unit 100 can be moved to any position by X-direction moving device 150, Y-direction moving device 152, and Z-direction moving device 154, and can be rotated to any angle by rotation device 156. Thus, cut and clinch unit 100 can be positioned at any position under circuit board 12 held by clamp device 52.

Figure 12:
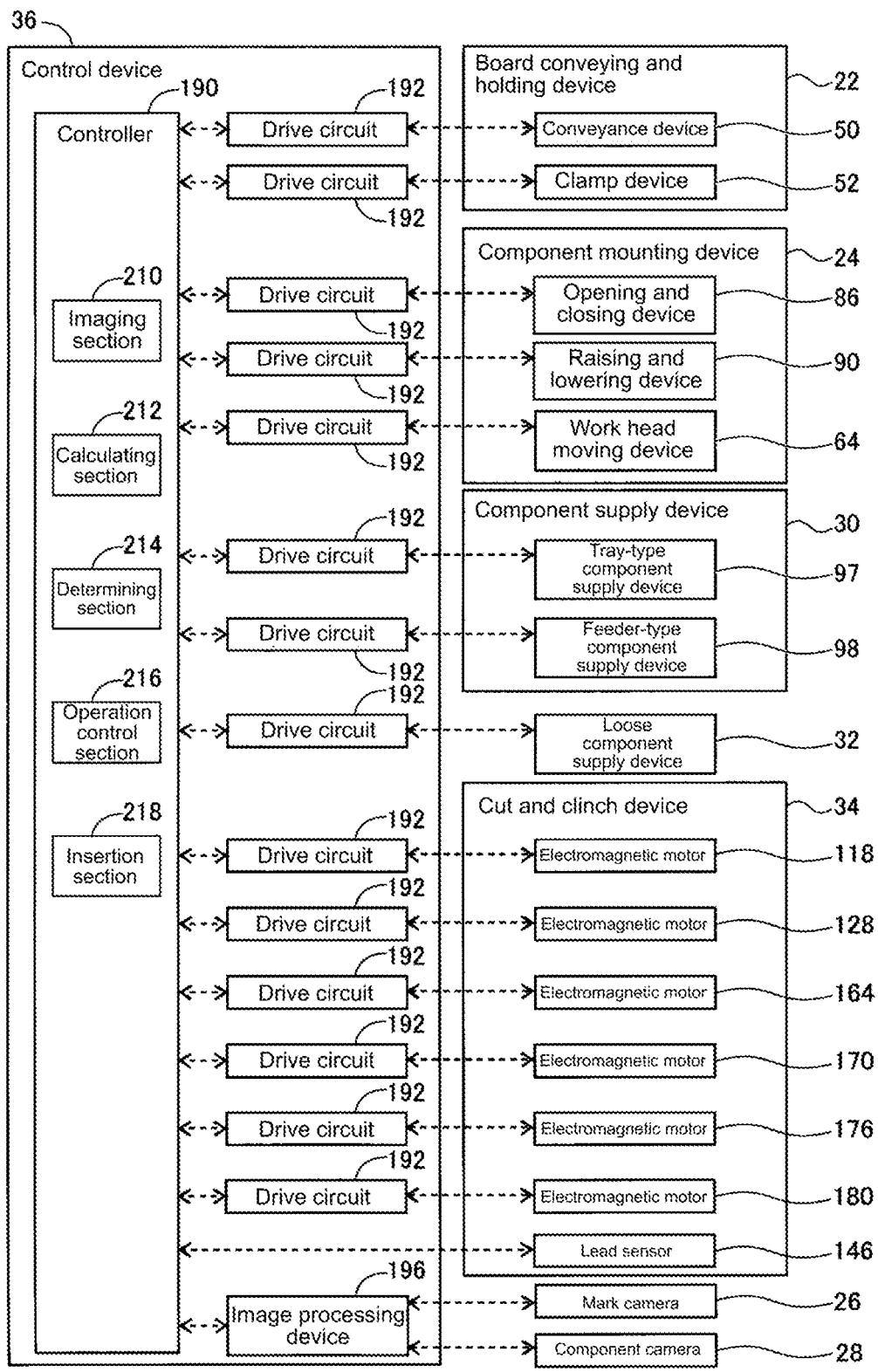
FIG. 12 is a block diagram showing a control device.

As shown in FIG. 12, control device 36 is provided with controller 190, multiple drive circuits 192, and image processing device 196. The multiple drive circuits 192 are connected to conveyance device 50, clamp device 52, work head moving device 64, opening and closing device 86, raising and lowering device 90, tray type component supply device 97, feeder type component supply device 98, loose component supply device 32, and electromagnetic motors 118, 128, 164, 170, 176, and 180. Controller 190 is provided with a CPU, ROM, RAM, and so on, is formed mainly from a computer, and is connected to the multiple drive circuits 192. By this, operation of board conveying and holding device 22, component mounting device 24, and so on is controlled by controller 190. Controller 190 is also connected to image processing device 196. Image processing device 196 is for processing image data acquired by mark camera 26 and component camera 28, and controller 190 acquires various information from the image data. Further, controller 190 is also connected to lead sensor 146 and acquires a detection value from lead sensor 146.

Component Mounter Operation

Component mounter 10, according to the above configuration, mounts components on circuit board 12 held by board conveying and holding device 22. With component mounter 10, it is possible to mount various components to circuit board 12; descriptions are given below of a case in which leaded components 92 are mounted on circuit board 12.

Specifically, circuit board 12 is conveyed to a work position, and is fixedly held at that position by clamp device 52. Next, mark camera 26 moves above circuit board 12 and images circuit board 12. And, controller 190 calculates information related to a holding position of a circuit board and the like based on the imaging data. Also, component supply device 30 or loose component supply device 32 supplies components at a specified supply position. One of the work heads 60 or 62 moves above the component supply position and holds a component using component holding tool 78.

Continuing, work head 60 or 62 holding leaded component 92 is moved above component camera 28, and leaded component 92 held by component holding tool 78 is imaged by component camera 28. Then, controller 190 calculates information related to a holding position of the component and the like based on the imaging data. Here, controller 190, based on the imaging data, also calculates the distance between the pair of leads 94 of leaded component 92 (hereinafter also referred to as "lead spacing distance"). Note that, in the present embodiment, the lead spacing distance is the distance between the center of the tip end surface of one of the pair of leads 94 and the center of the surface of the tip of the other of the pair of leads 94. Also, in the present disclosure, "calculates" includes processing by a computer of controller 190, and is for acquiring a specified value by performing processing with respect to each type of data.

When imaging of leaded component 92 by component camera 28 is finished, work head 60 or 62 holding leaded component 92 moves above circuit board 12, and corrects the error in the holding position of circuit board 12 and the error in the holding position of the component and so on. Then, the pair of leads 94 of leaded component 92 held by component holding tool 78 are inserted into two through-holes 208 (refer to FIG. 16) formed in circuit board 12. Here, cut and clinch unit 100 is moved below circuit board 12.

Specifically, first, leads 94 of leaded component 92 should be appropriately inserted into first insertion hole 130 and second insertion hole 136 of cut and clinch unit 100 via through-holes 208, so the distance between first insertion hole 130 and second insertion hole 136 of the pair of slide bodies 112 is adjusted. Here, with a conventional method, the distance between first insertion hole 130 and second insertion hole 136 of the pair of slide bodies 112 (hereinafter also referred to as "insertion hole spacing distance") is adjusted by pitch changing mechanism 114 such that the coordinates in the XY directions of the center of first insertion hole 130 of slide body 112 and the coordinates in the XY directions of the center of through-hole 208 of circuit board 12 are aligned. That is, the distance between the pair of slide bodies 112 is adjusted by pitch changing mechanism 114 such that the insertion hole spacing distance is the same as the distance between the two through-holes 208. Note that, the insertion hole spacing distance is the distance between the center of one of the pair of the first insertion holes 130 and the center of the other.

Figure 13:
FIG. 13 is a schematic view illustrating the relationship between through-holes of the board and insertion holes of the cut and clinch device.
Figure 13:
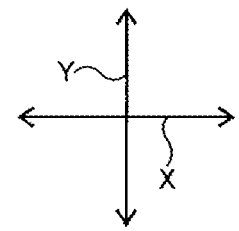

In this manner, by adjusting the insertion hole spacing distance, first insertion hole 130 of slide body 112 and through-hole 208 of circuit board 12 are positioned overlapping in the vertical direction. Note that, in the present disclosure, a state overlapping in the vertical direction refers to a state in which two or more target objects overlap when viewed from directly above or below, in other words, when two or more target objects are aligned in a direction perpendicular to circuit board 12, a height direction, an upright direction, or a Z direction. That is, a state in which the coordinates in the XY directions of two or more target objects are aligned. Thus, as shown in FIG. 13, the coordinates in the XY directions of the center of first insertion hole 130 of slide body 112 and the coordinates in the XY direction of the center of through-hole 208 of circuit board 12 are aligned. Because the internal dimension of second insertion hole 136 is similar to the internal dimension of through-hole 208, in FIG. 13, between the outer edge of first insertion hole 130 and the outer edge of through-hole 208 is the tapered surface of second insertion hole 136. Therefore, for example, even in a case in which lead 94 is somewhat deformed due to bending, curvature, or the like, and the coordinates in the XY directions of the surface of the tip of lead 94 and the coordinates in the XY directions of the first insertion hole 130 are deviated, the tip end surface of lead 94 inserted into through-hole 208 contacts the tapered surface of second insertion hole 136 and is inserted into first insertion hole 130 being guided by the tapered surface. In particular, as described above, because the internal dimension of first insertion hole 130 is slightly larger than the external dimension of lead 94, even in a case in which lead 94 is slightly bent or the like, lead 94 is inserted into first insertion hole 130 not directly, but being guide by the tapered surface of second insertion hole 136. Also, with component holding tool 78 that holds leaded component 92, by lead 94 being sandwiched by recess 95 of claw section 82 and support plate 84, bending, curvature, or the like of lead 94 is corrected, thus guaranteeing to a certain extent that lead 94 will be inserted into first insertion hole 130.

However, because component holding tool 78 holds leaded component 92 at a location close to the base section of lead 94, it is difficult to correct bending, curvature, or the like of lead 94 of the tip of lead 94. Therefore, there is a tendency for bending, curvature, or the like to remain in the tip of lead 94. With such a leaded component 92, there are cases in which the tip of a lead 94 that is curved or the like contacts the tapered surface of second insertion hole 136 at substantially a right angle, and is not guided by the tapered surface to first insertion hole 130. Also, it is necessary to have a slight gap between second insertion hole 136 and first insertion hole 130 to maintain sliding of movable section 122 with respect to fixed section 120. Thus, when the tip end surface of lead 94 is guided to first insertion hole 130 along the tapered surface of second insertion hole 136, there are cases in which the tip end surface of lead 94 gets caught in the gap between the second insertion hole 136 and the first insertion hole 130. Thus, there are cases in which lead 94 is not inserted into first insertion hole 130 even though the coordinates in the XY directions of first insertion holes 130 of slide body 112, and the coordinates in the XY directions of through-hole 208 of circuit board 12 are aligned.

Figure 14:
FIG. 14 is a schematic view illustrating the relationship between the tip end surface of the leads and insertion holes of the cut and clinch device.
Figure 14:
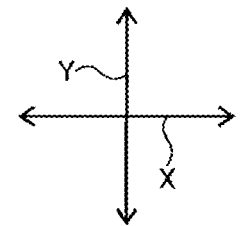

Considering this, with component mounter 10, the distance between the pair of slide bodies 112 is adjusted by pitch changing mechanism 114 such that the insertion hole spacing distance is the same as the lead spacing distance calculated by controller 190. Thus, first insertion hole 130 of slide body 112 and the tip end surface of lead 94 are in a state overlapping in the vertical direction. That is, the first insertion hole 130 and the tip end surface of lead 94 are in an overlapping state when viewed from directly above or below, and are aligned in a direction perpendicular to circuit board 12, a height direction, an upright direction, or a Z direction. In such a state, as shown in FIG. 14, the coordinates in the XY directions of the tip end surface of lead 94 and the coordinates in the XY directions of first insertion hole 130 are aligned. Therefore, even in a case in which the tip end section of lead 94 is deformed due to bending, curvature, or the like, lead 94 can be inserted directly into first insertion hole 130. That is, lead 94 can be inserted into first insertion hole 130 without the tip end section of lead 94 being guided by the tapered surface of second insertion hole 136. Thus, it is possible to reliably insert lead 94 into first insertion hole 130.

However, to insert lead 94 into first insertion hole 130 via through-hole 208 of circuit board 12, it is necessary to move slide body 112 within a range in which first insertion hole and through-hole 208 overlap in the vertical direction. In detail, insertion hole spacing distance Lmin that occurs when the pair of first insertion holes 130 are closest together in a state with the pair of first insertion holes 130 and the pair of through-holes 208 overlapping in the vertical direction is calculated using the formula below (refer to FIG. 15).

$$L\min = L0 - 2 \times (R - r)$$

In the above formula, L0 is the distance between the center of one of the pair of through-holes 208 and the center of the other of the pair of through-holes 208; R is the radius of through-hole 208, and r is the radius of first insertion hole 130. Note that, L0, R, and r may be values set in advance, or may be values calculated based on imaging data from imaging of first insertion hole 130 and through-hole 208 performed by mark camera 26.

Also, insertion hole spacing distance Lmax that occurs when the pair of first insertion holes 130 are furthest apart in a state with the pair of first insertion holes 130 and the pair of through-holes 208 overlapping in the vertical direction is calculated using the formula below (refer to FIG. 16).

$$L\max = L0 + 2 \times (R - r)$$

Figure 15:
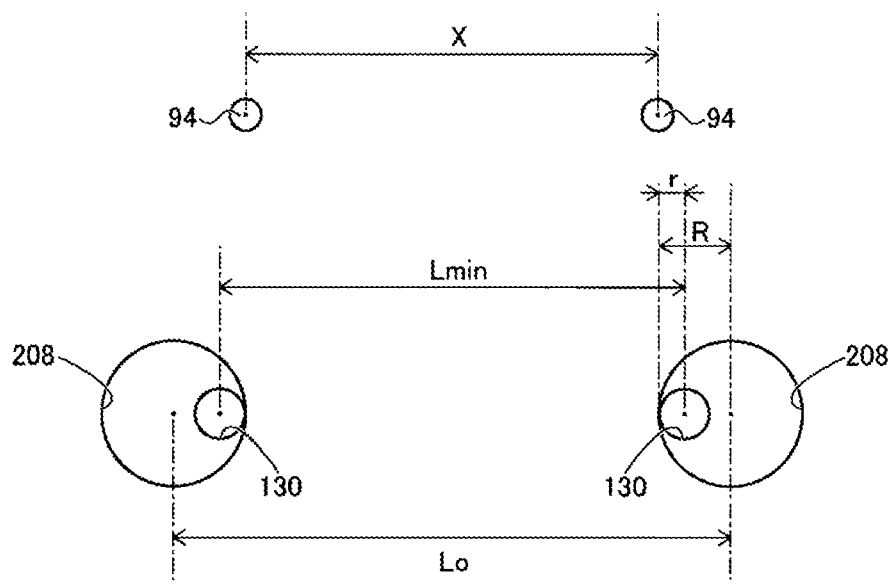
FIG. 15 is a schematic view illustrating the relationship between through-holes of the board and insertion holes of the cut and clinch device.

Here, as shown in FIG. 15, in a case in which lead spacing distance X calculated by controller 190 is less than insertion hole spacing distance Lmin, when the pair of slide bodies 112 is moved such that the distance between the pair of first insertion holes 130 is lead spacing distance X, the pair of first insertion holes 130 and the pair of through-holes 208 do not overlap in the vertical direction. Also, as shown in FIG. 16, in a case in which lead spacing distance X calculated by controller 190 is longer than insertion hole spacing distance Lmax, when the pair of slide bodies 112 is moved such that the distance between the pair of first insertion holes 130 is lead spacing distance X, the pair of first insertion holes 130 and the pair of through-holes 208 do not overlap in the vertical direction. In other words, in a case in which lead spacing distance X calculated by controller 190 is equal to or greater than insertion hole spacing distance Lmin and equal to or less than insertion hole spacing distance Lmax, when the pair of slide bodies 112 is moved such that the distance between the pair of first insertion holes 130 is lead spacing distance X, the pair of first insertion holes 130 and the pair of through-holes 208 do overlap in the vertical direction.

Therefore, it is determined whether the lead spacing distance calculated by controller 190 is determined to be within a specified range, that is, equal to or greater than insertion hole spacing distance Lmin and equal to or less than insertion hole spacing distance Lmax, and in a case in which it is determined that the lead spacing distance calculated by controller 190 is within a specified range, the insertion hole spacing distance is adjusted. On the other hand, in a case in which it is determined that the lead spacing distance calculated by controller 190 is outside a specified range, the leaded component 92 held by component holding tool 78 is determined to be defective, and is discarded to a discard area (not shown).

Also, when the insertion hole spacing distance is adjusted to be the same as the lead spacing distance, the position of cut and clinch unit 100 is adjusted by operation of unit moving device 102. In detail, cut and clinch unit 100 is rotated by operation of rotation device 156 such that a straight line connecting the pair of through-holes 208 and a straight line connecting the pair of insertion holes 130 are parallel. Also, cut and clinch unit 100 is moved in the XY directions by operation of X-direction moving device 150 and Y-direction moving device 152 such that the center point of the straight line connecting the pair of through-holes 208 and the center point of the straight line connecting the pair of insertion holes 130 are aligned. Further, cut and clinch unit 100 is raised and lowered by operation of Z-direction moving device 154 such that the upper end of slide body 112 is positioned slightly below the lower surface of circuit board 12.

Figure 17:
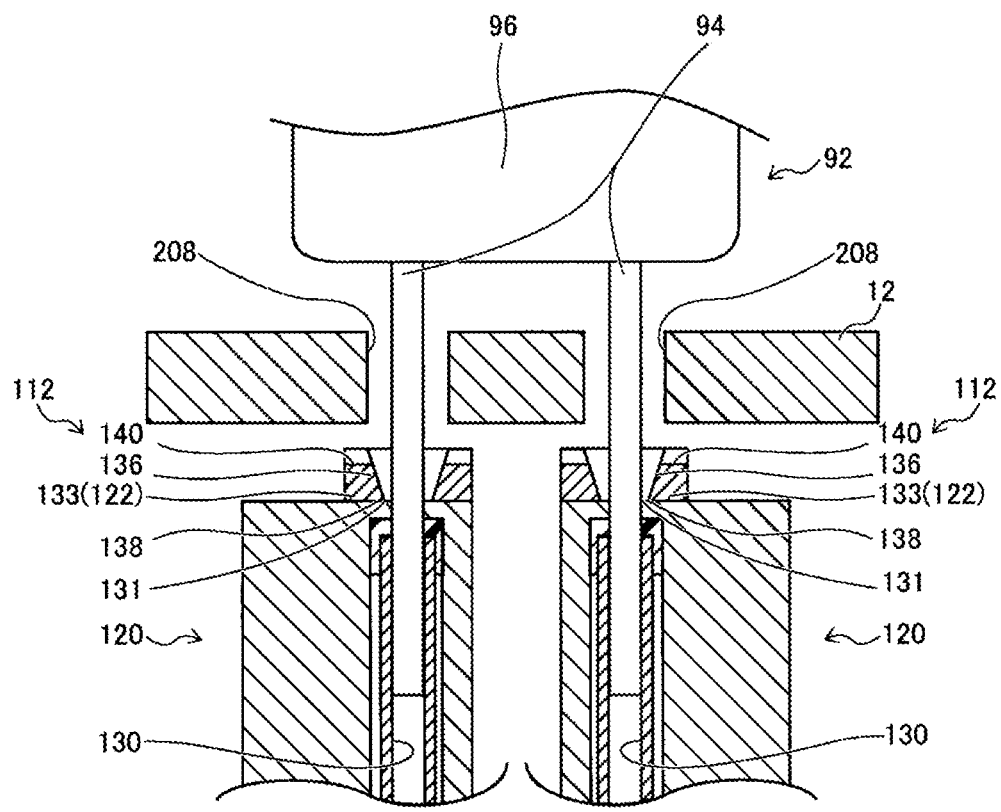
FIG. 17 is a cross section view of a cut and clinch unit immediately before leads of a leaded component are cut.

Then, when rotation and movement in the XYZ directions of cut and clinch unit 100 are complete, by lowering the leaded component 92 held by component holding tool 78, leads 94 of leaded component 92 are inserted into through-holes 208 of circuit board, and as shown in FIG. 17, are inserted into first insertion holes 130 via second insertion holes 136. Here, as shown in FIG. 14, because the coordinates in the XY directions of the tip end surface of leads 94 and the coordinates in the XY directions of first insertion holes 130 are aligned, leads 94 are reliably inserted into first insertion holes 130.

Figure 18:
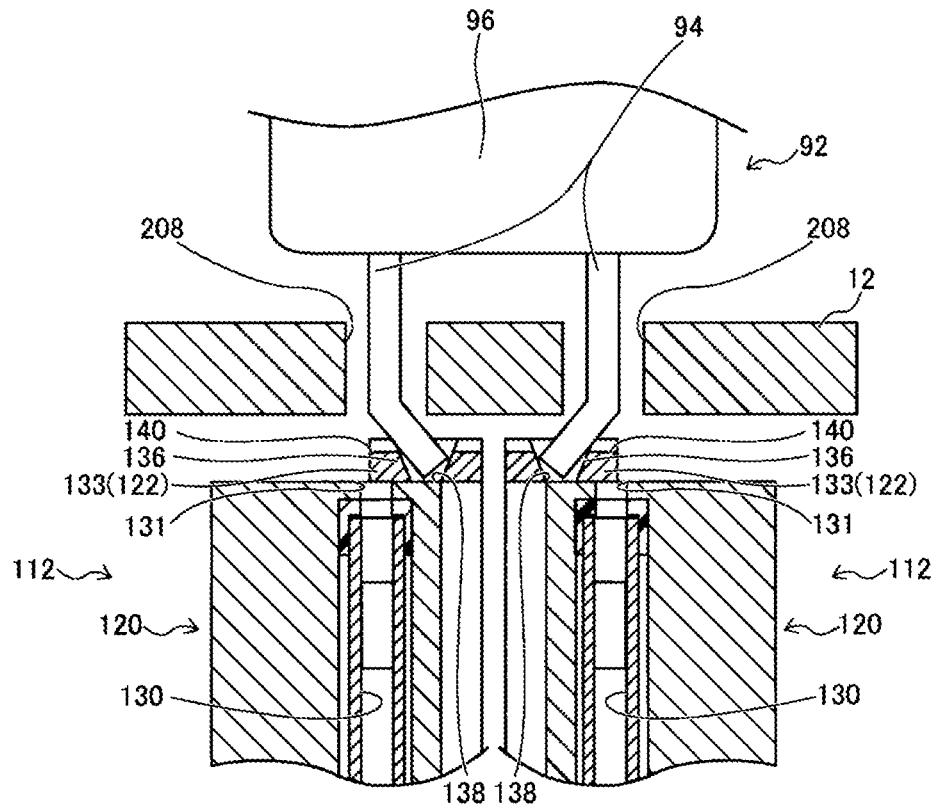
FIG. 18 is a cross section view of a cut and clinch unit after leads of a leaded component have been cut.

Next, when lead 94 has been inserted into first insertion hole 130 via second insertion hole 136, the pair of movable sections 122 is slid by operation of slide device 124 in the direction towards each other. Thus, as shown in FIG. 18, lead 94 is cut by fixed blade 131 of first insertion hole 130 and movable blade 138 of second insertion hole 136. Then, the tip section separated by the cutting of lead 94 falls through first insertion hole 130 and is discarded in discard box 132.

Also, the pair of movable sections 122, after cutting leads 94, are slid further in the direction towards each other. Thus, the new tip section formed by the cutting of lead 94 is bent along the tapered surface of the inside of second insertion hole 136 in accordance with the sliding of movable section 122, and the tip section of lead 94 is bent along guide groove 140 by the further sliding of movable section 122. Thus, leaded component 92 is mounted into circuit board 12 in a state in which leads 94 are bent substantially at right angles so as to be prevented from coming out of through-holes 208.

Note that, as shown in FIG. 12, controller 190 of control device 36 includes imaging 210, calculating section 212, determining section 214, operation control section 216, and insertion section 218. Imaging section 210 is a functional section for using component camera 28 to image leaded component 92 held by component holding tool 78. Calculating section 212 is a functional section for calculating the lead spacing distance based on the imaging data. Determining section 214 is a functional section for determining whether the calculated lead spacing is within a specified range. Operation control section 216 is a functional section for controlling operation of pitch changing mechanism such that the insertion hole spacing distance and the lead spacing distance are the same. Insertion section 218 is a functional section for inserting lead 94 of leaded component 92 into first insertion hole 130 after the insertion hole spacing distance and the lead spacing distance have been made the same.

Further, component mounter 10 is an example of a board work system. Component camera 28 is an example of an imaging device. Cut and clinch device 34 is an example of a bending device. Control device 36 is an example of a control device. Clamp device 52 is an example of a holding device. Work heads 60 and 62 are examples of a mounting head. Unit main body 110 is an example of a holding body. Slide body 112 is an example of a moving body. Electromagnetic motor 118 is an example of a drive source. First insertion hole 130 and second insertion hole 136 are examples of an insertion hole. Insertion hole spacing distance Lmin is an example of a first distance. Insertion hole spacing distance Lmax is an example of a second distance. A process performed by imaging section 210 is an example of an imaging process. A process performed by calculating section 212 is an example of an acquiring process. A process performed by determining section 214 is an example of a determining process. A process performed by operation control section 216 is an example of an operation control process. A process performed by insertion section 218 is an example of an inserting process.

Further, the present disclosure is not limited to the above example embodiments, and various changed or improved methods of embodiment are possible based on the knowledge of someone skilled in the art. Specifically, for example, in an embodiment above, component holding tool 78 that is capable of correcting bending or the like of leads 94 is used, but a component holding tool not capable of correcting bending or the like of leads 94 may be used, for example, a suction nozzle or the like. With component mounter 10, because the coordinates in the XY direction of the tip end surface of lead 94 and the coordinates in the XY directions of first insertion hole 130 are aligned, it is possible to reliably insert lead 94 into first insertion hole 130 even when using a component holding tool not capable of correcting bending or the like of lead 94.

Also, in an embodiment above, descriptions are given with the insertion target of lead 94 as first insertion hole (internal diameter L1) 130, but as the insertion target of lead 94, it is possible to use the opening on the lower end section (internal diameter L2) of second insertion hole 136, or the opening on the upper end section (internal diameter L3) of second insertion hole 136. In other words, the distance between the pair of slide bodies 112 may be adjusted by pitch changing mechanism 114 such that the distance between the openings on the upper end section of the pair of second insertion holes 136, or the openings on the lower end section of the pair of second insertion holes 136, are the same as the calculated lead spacing distance.

Figure 19:
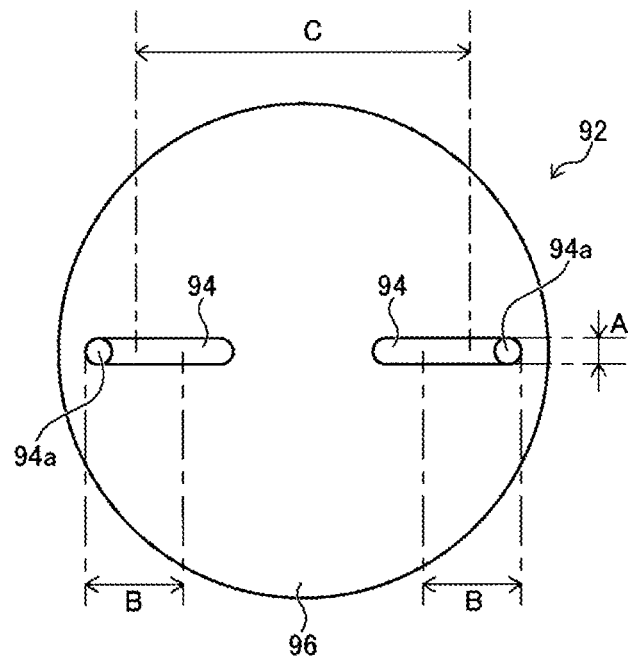
FIG. 19 shows the leaded component from below.

Also, with an embodiment above, the lead spacing distance is taken as the distance between the tip end surfaces of the pair of leads 94, but the lead spacing distance may be the distance between the pair of leads 94. That is, a portion other the tip end section of lead 94 may be identified as a reference position, and the distance between the reference position on one of the pair of leads 94 and a reference on the other of the pair of leads 94 may be taken as the lead spacing distance. In detail, as shown in FIG. 19, to describe a case in which the pair of leads 94 are bent such that the tip end sections get further apart as they extend. Here, in the figure, the lead diameter of lead 94 is A. When such a component 92 is imaged from below, lower end surface 94a of lead 94 is positioned on the outside from the base section, that is, the end of lead 94 connected to component main body 96. Based on imaging data from this state, controller 190 identifies set distance B and the position on the base section from the outside edge of lower end surface 94a of lead 94, and uses the center point between the identified position and the outside edge of lower end surface 94a of lead 94. Note that, set distance B is the internal diameter of the insertion hole that is the insertion target of lead 94. And, the distance between the reference position of one of the pair of leads 94 and the reference position of the other of the pair of leads 94 is calculated as lead spacing distance C. In a case in which the distance between the pair of slide bodies 112 is adjusted by pitch changing mechanism 114 such that calculated lead spacing distance C is the same as the insertion hole spacing distance, lower end surface 94a of lead 94 and the insertion hole that is the insertion target are overlapping in the vertical direction. Thus, it is possible to appropriately insert lead 94 into an insertion hole that is an insertion target.

REFERENCE SIGNS LIST

10: component mounter (board work system); 28: component camera (imaging device); 34: cut and clinch device (bending device); 36: control device; 52: clamp device (holding device); 60: work head (mounting head); 62: work head (mounting head); 110: unit main body (holding body); 112: slide body (moving body); 118: electromagnetic motor (drive source); 130: first insertion hole (insertion hole); 136: second insertion hole (insertion hole)

The invention claimed is:

1. A board work system comprising:
   a holding device configured to hold a board, the board being formed with a through-hole into which a lead of a leaded component is to be inserted;
   a mounting head configured to hold the leaded component and to insert each of a pair of leads of the held leaded component into the through-holes of the board held by the holding device;
   a bending device configured to bend a lead inserted into the insertion hole, the bending device including
   (A) a pair of moving bodies each including an insertion hole into which a lead is inserted via the through-hole,
   (B) a holding body configured to hold the pair of moving bodies such that the moving bodies can be moved towards and away from each other, and
   (C) a drive source that changes an insertion hole spacing distance that is a distance between the insertion holes to a given distance by moving the pair of moving bodies towards and away from each other;
   an imaging device configured to image the leaded component held by the mounting head; and
   a control device, the control device being configured to control the drive source based on the lead spacing distance that is a distance between the pair of leads obtained by the imaging device imaging the pair of leads of the leaded component prior to being inserted into the through-holes.

2. The board work system according to claim 1, wherein the control device is configured to control the drive source such that the through-hole and the insertion hole into which the lead is to be inserted via the through-hole are in an overlapping state.

3. The board work system according to claim 1, wherein in a case in which, in a state with the pair of through-holes into which the pair of leads of the leaded component are to be inserted and the pair of insertion holes into which the leads are to be inserted via the pair of through-holes overlapping, the insertion hole spacing distance when the pair of insertion holes are closest to each other is defined as a first distance, and the insertion hole spacing distance when the pair of insertion holes are furthest away from each other is defined as a second distance, the control device is configured to control the drive source when the calculated lead spacing distance is equal to or greater than the first distance and equal to or less than the second distance.

4. An insertion method for inserting a pair of leads of a leaded component into a pair of insertion holes via a pair of through-holes in a board work system, the board work system including
- a holding device configured to hold a board, the board being formed with a through-hole into which a lead of a leaded component is to be inserted;
- a mounting head configured to hold the leaded component and to insert each of the pair of leads of the held leaded component into the through-holes of the board held by the holding device;
- a bending device configured to bend a lead inserted into the insertion hole, the bending device including (A) a pair of moving bodies each including an insertion hole into which a lead is inserted via the through-hole, (B) a holding body configured to hold the pair of moving bodies such that the moving bodies can be moved towards and away from each other, and (C) a drive source that changes an insertion hole spacing distance that is a distance between the insertion holes to a given distance by moving the pair of moving bodies towards and away from each other; and
- an imaging device configured to image the leaded component held by the mounting head, the insertion method comprising:

imaging the leaded component held by the mounting head;

acquiring a lead spacing distance that is a distance between the pair of leads of the leaded component based on imaging data obtained by the imaging; controlling operation of the drive source based on the acquired lead spacing distance; and inserting the pair of leads of the leaded component held by the mounting head into the pair of insertion holes via the pair of through-holes.

* * * * *